United States Patent
Boulin

(10) Patent No.: US 8,476,936 B2
(45) Date of Patent: Jul. 2, 2013

(54) SENSOR CONNECTION CIRCUIT

(75) Inventor: Martial Boulin, Rennes (FR)

(73) Assignee: STMicroelectronics (Tours) SAS, Tours (FR)

( * ) Notice: Subject to any disclaimer, the term of this patent is extended or adjusted under 35 U.S.C. 154(b) by 213 days.

(21) Appl. No.: 12/942,383

(22) Filed: Nov. 9, 2010

(65) Prior Publication Data

US 2011/0109368 A1    May 12, 2011

(30) Foreign Application Priority Data

Nov. 10, 2009  (FR) ...................................... 09-57946

(51) Int. Cl.
*H03K 5/153* (2006.01)

(52) U.S. Cl.
USPC .......................................................... 327/77

(58) Field of Classification Search
USPC .................................... 327/77, 143, 205–206
See application file for complete search history.

(56) References Cited

U.S. PATENT DOCUMENTS

| 5,841,301 A | 11/1998 | Horie et al. |
| 6,683,481 B1 * | 1/2004 | Zhou et al. .................... 327/143 |
| 7,106,107 B2 * | 9/2006 | Bhattacharya et al. ......... 327/77 |
| 7,609,049 B1 * | 10/2009 | Tian et al. .................. 324/76.11 |
| 2003/0048008 A1 | 3/2003 | Castagnet et al. |
| 2009/0219081 A1 * | 9/2009 | Kwon et al. .................. 327/536 |

FOREIGN PATENT DOCUMENTS

| JP | 2002300011 A * 10/2002 |
| WO | WO 2008/048024 A1    4/2008 |

OTHER PUBLICATIONS

Republique Francaise, Institut National de la Properiete Industrielle, Rapport de Recherche Preliminaire (Preliminary Search Report) issued in French Patent Application No. FR 0957946 on Sep. 10, 2010 (2 pages).

\* cited by examiner

*Primary Examiner* — Quan Tra

(74) *Attorney, Agent, or Firm* — Slater & Matsil, L.L.P.

(57) ABSTRACT

A circuit for converting the state of a sensor into a signal interpretable by an electronic circuit, including: a comparator of the voltage level of an input terminal with respect to a reference level, the sensor being intended to be connected between a terminal of application of a first power supply voltage and the input terminal; a current-limiting element between said input terminal and the ground; and a switching element in series with the current source and intended to be controlled by a pulse train.

17 Claims, 4 Drawing Sheets

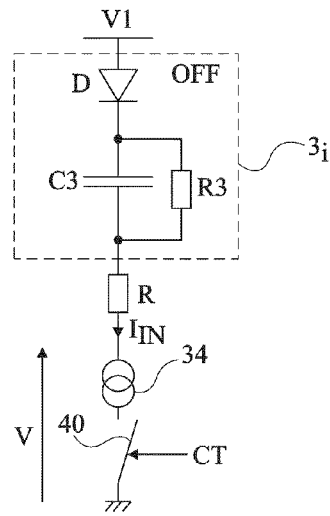
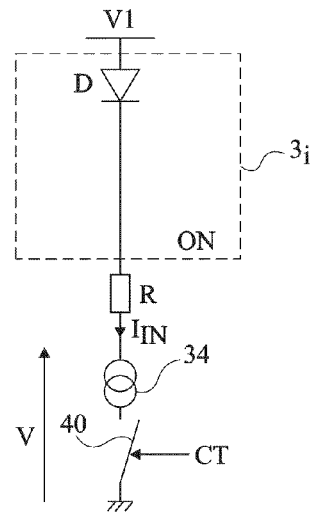
Fig 5A  Fig 5B
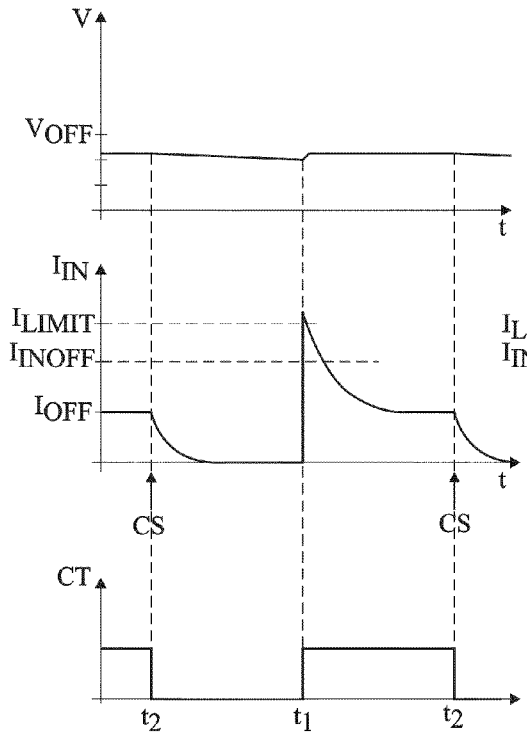
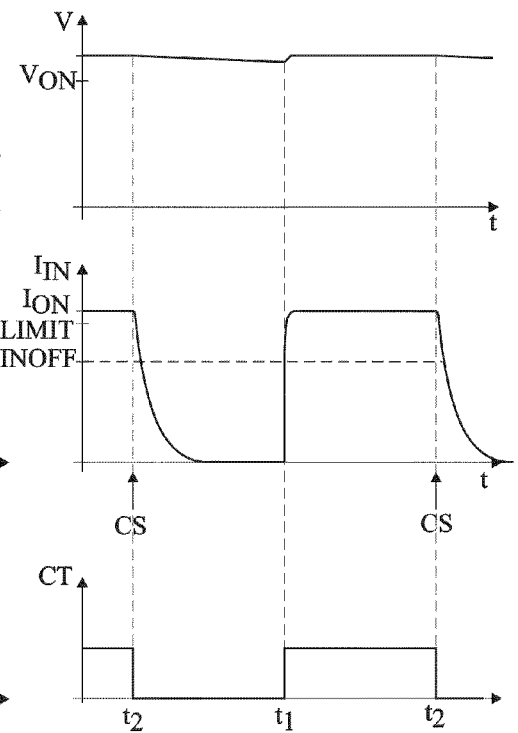
Fig 6A  Fig 6B

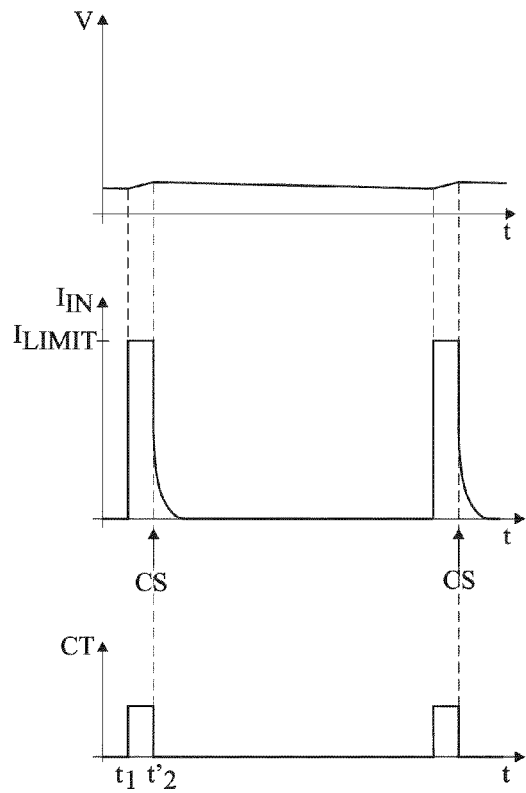 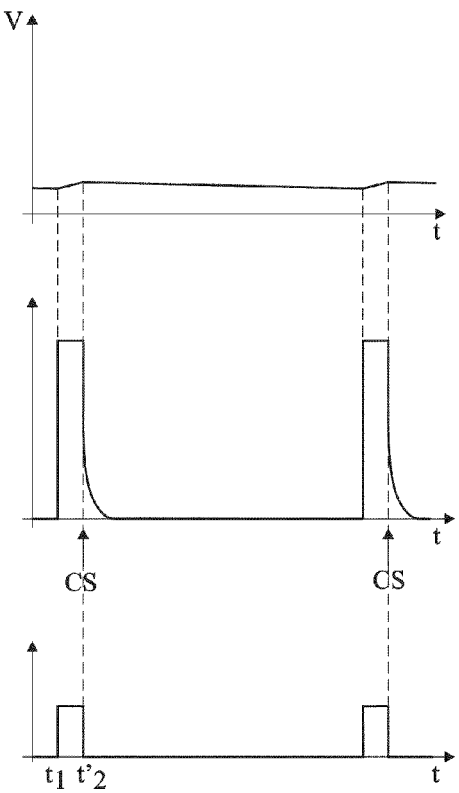
Fig 7A
Fig 7B
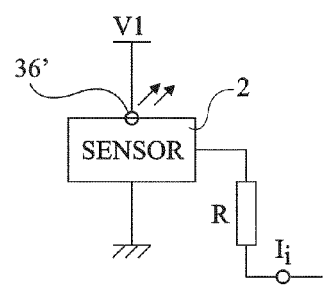
Fig 8

SENSOR CONNECTION CIRCUIT

This application claims priority to French Patent Application 09/57946, which was filed Nov. 10, 2009 and is incorporated herein by reference.

TECHNICAL FIELD

The present invention generally relates to electronic circuits and, more specifically, to a circuit for connecting sensors to a digital system, for example, a microcontroller.

The present invention more specifically applies to programmable logic controllers and interfaces between proximity sensors and a microcontroller.

BACKGROUND

Sensor connection interfaces, currently called "current limiter terminations" (CLTs), are interposed between sensors delivering a two-state electric response and the analog inputs of an electronic circuit. The function of such interfaces is to size the signals delivered by the sensor to make them compatible with the levels acceptable by the electronic circuit.

A first family of sensors involves so-called "two-wire" sensors, where the sensor power supply transits through the output of the sensor, and thus through the interface between the sensor and the microcontroller. According to the state of the detection or measurement element of the sensor, said sensor delivers a high or low state, that is, it connects or not the power supply terminal to the output terminal of the sensor.

A second family relates to so-called three-wire sensors where the sensor power supply is separated from the output signal.

The sensor supply voltage is often different from that of the microcontroller. Therefore, the interface circuit is used to limit the current and to provide a signal acceptable to the microcontroller inputs.

However, the difference between power supply voltages generates a strong dissipation in interface circuits, especially for two-wire sensors. This dissipation may reach several watts for circuits intended to process many inputs.

Such a high dissipation currently limits the number of inputs of a same interface circuit. It would be desirable to have interface circuits with a greater number of inputs.

It would further be desirable to decrease the dissipation of the interface circuit.

SUMMARY OF THE INVENTION

In a first aspect, the present invention provides for a circuit for converting the state of a sensor into a signal interpretable by an electronic circuit. The sensor is configured to be connected between a terminal of application of a first power supply voltage and an input terminal. The circuit comprises a comparator of the voltage level of the input terminal with respect to a reference level, and a current-limiting element between said input terminal and ground. The circuit further includes a switching element in series with the current-limiting element and configured to be controlled by a pulse train.

In another aspect, the present invention provides for a method of acquiring the state of a sensor. The method includes receiving at an input terminal a current corresponding to a state of the sensor, and limiting the current flowing between said input terminal and ground by way of a current-limiting element. The method further includes controlling operation of said current-limiting element by way of a switching element, said switching element controlled by a pulse train, and comparing a voltage level of said input terminal with respect to a reference level.

BRIEF DESCRIPTION OF THE DRAWINGS

The foregoing objects, features, and advantages of the present invention will be discussed in detail in the following non-limiting description of specific embodiments in connection with the accompanying drawings.

FIG. 5A shows the equivalent diagram of the circuit of FIG. 4 with a two-wire sensor in an off position;

FIG. 5B shows the equivalent diagram of the circuit of FIG. 4 with a two-wire sensor in an on position;

FIG. 6A illustrates the operation of the circuit of FIG. 4, with a two-wire sensor in off position and a first example of a duty cycle;

FIG. 6B illustrates the operation of the circuit of FIG. 4, with a two-wire sensor in on position and the first example of a duty cycle;

FIG. 7A illustrates the operation of the circuit of FIG. 4, with a two-wire sensor in off position and a second example of a duty cycle;

FIG. 7B illustrates the operation of the circuit of FIG. 4, with a two-wire sensor in on position and the second example of a duty cycle; and FIG. 8 shows the electric diagram of a three-wire sensor.

DETAILED DESCRIPTION OF ILLUSTRATIVE EMBODIMENTS

Figure 1:
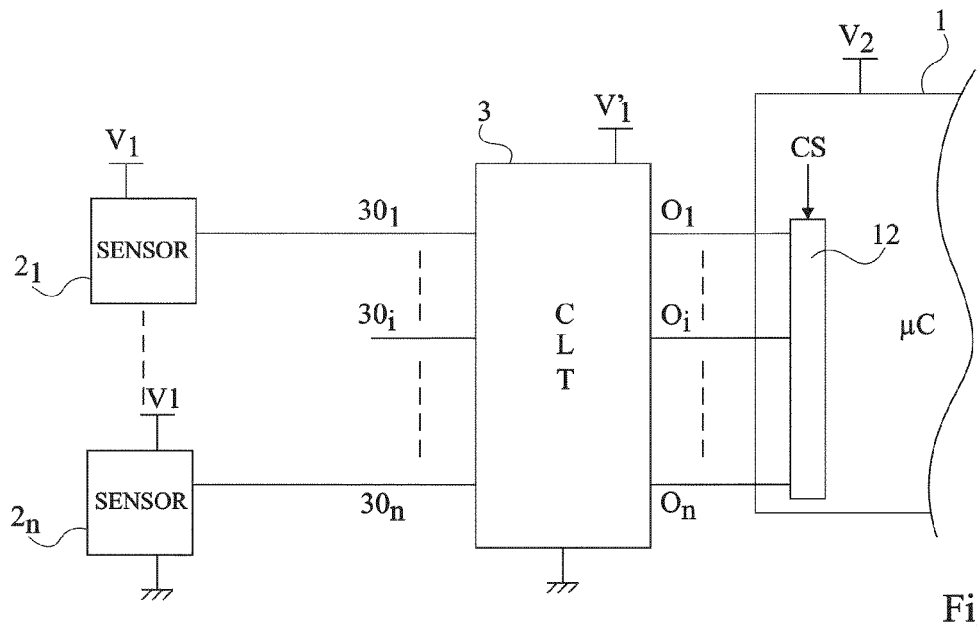
FIG. 1 is a block diagram of an example of a sensor system of the type to which the present invention applies.

Before addressing details of a specific embodiment, general features and advantages of the illustrative embodiments are discuss. An advantageous feature of embodiments of the invention may include overcoming all or part of the disadvantages of conventional interface circuits. Another advantageous feature may include decreasing the power dissipation of a circuit for connecting sensors to an electronic circuit.

Some embodiments of the present invention may be relatively easy to implement. Particular embodiments of the present invention provide a solution specifically adapted to sensors according to the 61131-2 standard. These advantageous features will become more clear in the light of the following detailed description of certain illustrative embodiments.

The same elements have been designated with the same reference numerals in the different drawings and the timing diagrams have been drawn out of scale. For clarity, only those elements which are useful to the understanding of the present invention have been shown and will be described. In particular, the sensors used by the described interface circuit have not been detailed, the present invention being compatible with any usual sensor. Further, the destination of the signals delivered by the interface circuit has not been detailed either, the present invention being here again compatible with usual applications.

FIG. 1 is a block diagram illustrating a system comprising a microcontroller 1 for exploiting signals delivered by sensors (SENSOR) $2_1, \ldots 2_i, \ldots 2_n$ (i ranging between 1 and n). An output terminal of each sensor is connected to an input terminal $30_1, \ldots 30_i, \ldots 30_n$ of an interface circuit 3 (CLT) having respective outputs $O_1, \ldots O_i, \ldots O_n$ connected to inputs of microcontroller 1 or another electronic processing circuit. To be exploited by the microcontroller, the signals present on its input terminals are sampled at regular intervals (in parallel or sequentially). This function is illustrated by a block 12 controlled by a signal CS (Chip Select) of the microcontroller.

The different sensors $2_i$ are powered with a voltage $V_1$ different from power supply voltage $V_2$ of the microcontroller. For simplification, all sensors $2_i$ have been illustrated as powered with a same voltage $V_1$. This voltage may however be different from one sensor to another. Interface circuit 3 is, for example, powered with voltage $V'_1$.

In the example of FIG. 1, an example of a two-wire sensor $2_1$ (having its ground connection provided by circuit 3) and an example of three-wire sensors $2_n$ (provided with a ground connection so that the sensor power supply is dissociated from the output signal) have been illustrated.

Figure 2:
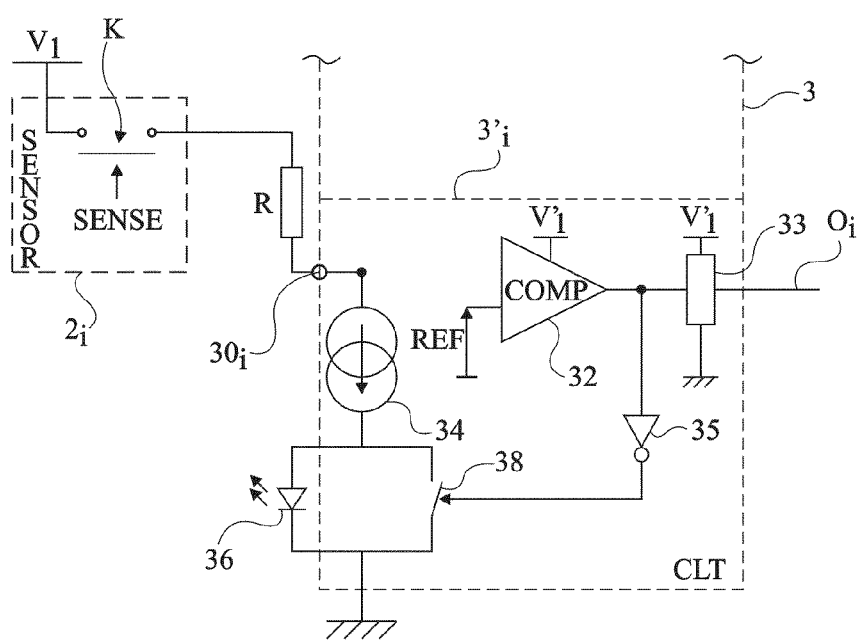
FIG. 2 shows the electric diagram of a usual two-wire sensor connection circuit.

FIG. 2 is an electric diagram of an exemplary two-wire sensor $2_i$ associated with a stage $3'_i$ of a usual interface circuit. Typically, the sensor senses data (symbolized by a signal SENSE) which condition the state of a switch K or the like. A terminal of switch K receives power supply voltage $V_1$ while its other terminal is connected, via a resistor R, to an input terminal $30_i$ of circuit 3. Conversion or interface stage $3'_i$ comprises a comparator 32 (COMP) which transmits its state to a level-matching circuit at voltage $V_2$ generated from voltage $V'_1$. This comparator compares the level present on input terminal $30_i$ with a reference level REF. The output of level adapter 33 is connected to the output terminal of stage $3'_i$ directed towards the microcontroller. Terminal $30_i$ is further grounded via a current-limiting element 34 and through either a light-emitting diode (LED) 36 (or any other visual indicator) or a switch 38 controlled by the output state of comparator 32 through an inverter 35. In the example of FIG. 2, switch 38 is in parallel with light-emitting diode 36 between current limiter 34 and the ground. When switch K of the sensor is off, no current flows through resistor R. The level of terminal $30_i$ is thus low and the output of comparator 32 provides a low level. Inverter 35 inverts this level so that switch 38 is turned on and diode 36, short-circuited by switch 38, is off When switch K turns on, a current, limited by current limiter 34, starts flowing, from the terminal of application of voltage $V_1$, through resistor R, and into switch 38. The level at the measurement input of comparator 32 corresponds to the level set by power supply voltage $V_1$ minus the voltage drops across the sensor and resistor R. When this level reaches voltage REF, the output of comparator 32 switches and exhibits a high level. This state switching is interpreted by microcontroller 1, for example, as a state 1. Further, switch 38 turns off and the current then flows through diode 36, visually confirming state 1.

Figure 3:
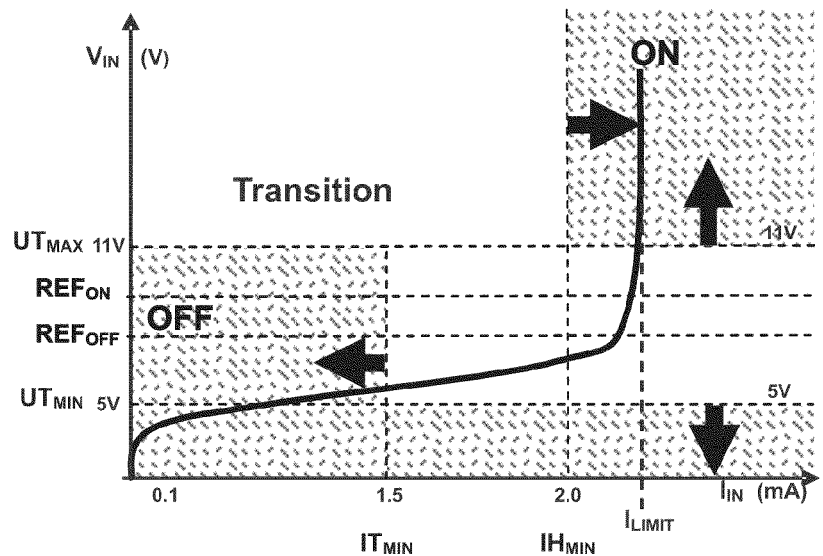
FIG. 3 illustrates the voltage-vs.-current characteristics of a two-wire sensor in the range of values defined by the 61131-2 standard.

FIG. 3 illustrates the operation of stage $3'_i$ of FIG. 2 according to the 61131-2 standard. This standard sets not only voltage levels UTmin and UTmax at the output of sensor K, respectively below which the sensor must be considered as off (OFF) and beyond which the sensor must be considered as on (ON), but also levels ITmin and IHmin of the current in resistor R, respectively below which the sensor must be considered as off and beyond which the sensor must be considered as on. Typically, according to the 61131-2 standard to which it is referred as an example, level UTmin is 5 volts, level UTmax is 11 volts, level ITmin is 1.5 milliampere or 2 milliamperes, respectively for type-3 or type-2 sensors, and level IHmin is 2 milliamperes or 6 milliamperes, respectively for type-3 or type-2 sensors.

The voltage switching thresholds of interface $3'_i$ associated with resistor R are illustrated in FIG. 3 in the form of two levels $REF_{OFF}$ and $REF_{ON}$ showing a hysteresis of the comparator.

As indicated previously, there is a strong dissipation in stage $3'_i$. A dissipation greater than 500 milliwatts can quite often be observed with a conventional eight-input type-3 interface circuit. Such dissipation limits the number of inputs-outputs of circuit 3.

Figure 4:
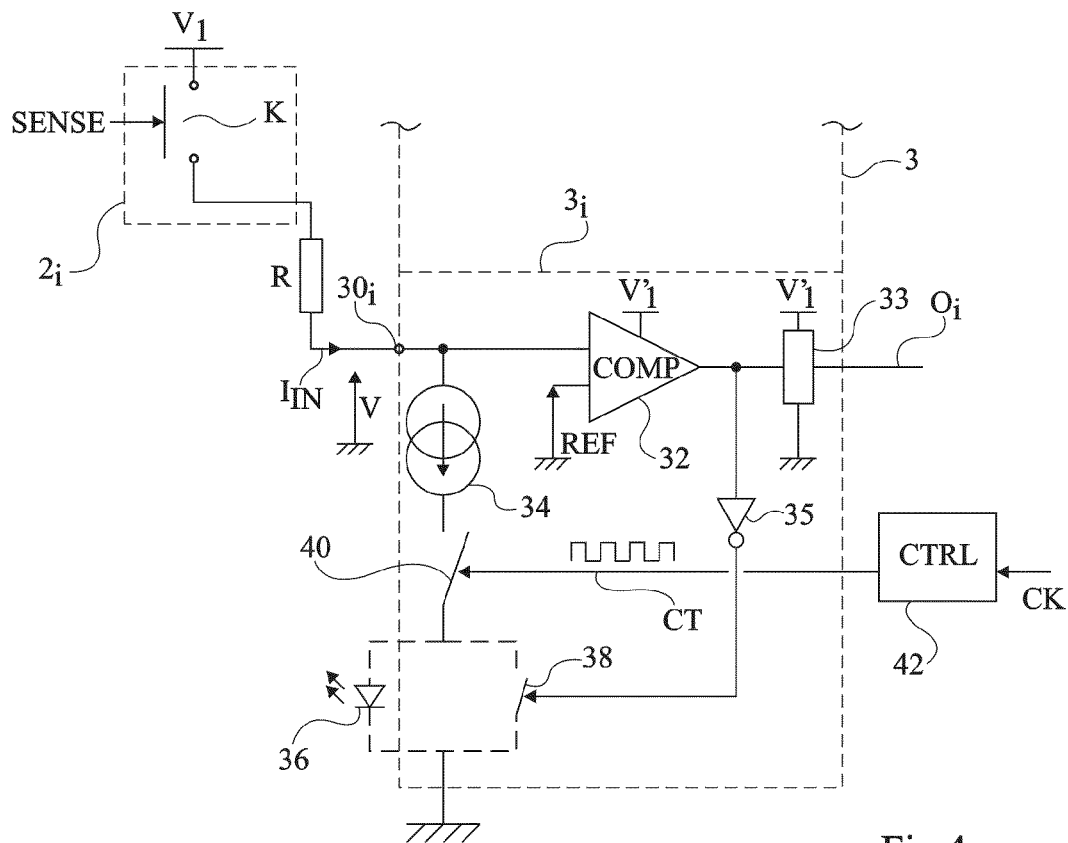
FIG. 4 shows a two-wire sensor connection circuit according to an embodiment of the present invention.

FIG. 4 shows the electric diagram of an embodiment of a stage $3_i$ of an interface circuit 3. In this example, the case of a two-wire sensor symbolized by switch K is considered. As previously, a comparator 32 has an input terminal connected to terminal $30_i$ and transmits, through the level adapter, on its output terminal $O_i$, the state of the sensor to a microcontroller (not shown). The current limiter 34 associated with series resistor R enables one to define the voltage at the comparator input.

According to the shown embodiment, a switch 40 is interposed between current limiter 34 and the indicator circuit (LED 36) on the one hand, and switch 38 on the other hand.

Switch 40 is controlled by a block 42 (CTRL) providing a pulse train. Block 42 thus receives a clock signal CK or any other control signal enabling it to generate a pulse train for controlling switch 40.

The order in which switch 40 and indicator circuit 36-38 have been arranged in the series association is of no importance. However, switch 40 and circuit 36-38 are preferably on the ground side in the series association with respect to current limiter 34, to limit the voltage thereacross. In particular, this enables a control of switch 40 by a signal generated from a voltage smaller than voltage $V_1$.

The switching of current limiter 34 by switch 40 enables one to decrease the power consumption, and thus the dissipation in stage $3_i$ and in sensor K, and therefore to decrease the power provided by the voltage source of level $V_1$. Preferably, the switching frequency ranges between 100 hertz and a few megahertz.

FIGS. 5A and 5B are equivalent electric diagrams of the sensor, in series with resistor R, current source 34, and switch 40 between the terminal of application of voltage $V_1$ and the ground, respectively for the sensor in the off state (OFF) and in the on state (ON).

FIGS. 6A and 6B are timing diagrams illustrating examples of voltage V across the sensor and of current $I_{IN}$ on terminal $30_i$ for a signal CT having a 50% duty cycle, respectively for the off (FIG. 5A) and on (FIG. 5B) positions of sensor $3_i$.

When the sensor is off, it has an impedance of capacitive type. This is illustrated in FIG. 5A by an equivalent diagram of the sensor formed of a diode D in series with a capacitor C3 associated in parallel with a resistor R3. Under the effect of the switching of switch 40, a variation of voltage V can be observed in the form of a capacitive discharge between two pulses of control signal CT.

As illustrated in FIG. 6A, on each rising edge (time t1) of signal CT (time when switch 40 turns on), a current peak appears on the shape of $I_{IN}$. Then, the current decreases capacitively to reach a plateau at a level $I_{OFF}$ as long as the control pulse is present. At the end of the control pulse (falling edge t2 of signal CT), switch 40 turns off. The current then disappears in a capacitive discharge decrease with a time constant depending on the values of equivalent capacitance C3 and of equivalent resistance R3 of the sensor. The level of voltage V is set by the respective values of the sensor impedance (essentially of resistor R3), of resistor R, and of current limiter 34 having values selected so that this level remains below threshold UTmin (FIG. 3).

In the on state (FIG. 5B), the sensor behaves as a diode D and its impedance is negligible.

As illustrated in FIG. 6B, on each rising edge (time t1) of control signal CT, that is, on each turning-on of switch 40, the current abruptly increases to reach a level $I_{ON}$. It remains at this level for the entire duration of the pulse (until time t2). At this time, switch 40 turns off and the current decreases.

On the side of voltage V, the level remains set by voltage $V_1$ minus the voltage drops in the sensor and resistor R. The dimensions of the current source and of resistor R are selected so that this level is greater than level $V_{ON}$.

It can be seen that, as far as the voltage is concerned, the range of values set by the standard (FIG. 3) is respected. However, as far as the current is concerned, this depends on the times at which the output state of the comparator is taken into account.

Advantage is taken of the capacitive discharge decrease of the current to synchronize the acquisition times (symbolized by times CS in FIGS. 6A and 6B) with the falling edges of signal CT. Thus, in the off state (FIG. 6A), current $I_{OFF}$ is, at this time, lower than threshold $I_{INOFF}$. Accordingly, be it for the voltage or for the current, the acquisition considers the sensor as effectively off. The choice of an acquisition at the end of a pulse of the pulse signal avoids the need to take the current peak into account at the turning on of the switch 40. In the on state (FIG. 6B), current $I_{IN}$ has not decreased yet and is still greater than current $I_{INOFF}$. Preferably, the components are sized so that it is even greater than current $I_{LIMIT}$.

The above shapes are assumed in steady state, that is, subsequently to a voltage settling phase at the powering on of the sensor. To avoid wrong detections at the starting, the detection result is only taken into account at the end of a starting phase (in practice, a few milliseconds).

FIGS. 7A and 7B illustrate the operation of the senor of FIGS. 5A and 5B for a control signal CT having a lower duty cycle (smaller than 10%). To better underline the operation, the case of a control signal CT having a greater frequency than in FIGS. 6A and 6B is considered. In the same way as for FIGS. 6A and 6B, on each pulse of control signal CT, current $I_{IN}$ reaches current $I_{LIMIT}$. However, the small duty cycle associated with the highest frequency results in that at the end (time t2') of the control pulses, synchronized with acquisition times CS, the current has not had time to decrease yet. Accordingly, whether the sensor is off or on, the detection indicates an on sensor (ON). Voltage V remains at a low level.

As a result, circuit $3_i$ is not capable of differentiating the off state from the on state.

The foregoing shows that the duty cycle of the control signal is selected, taking into account the sensor characteristics, so that its pulse response is such that the current has, in the OFF state, sufficiently decreased at the acquisition times.

The smaller the duty cycle, the lower the dissipation. However, a compromise must thus be made according to the pulse response of the sensor. The switching frequency for example ranges between 100 hertz and a few megahertz and the duty cycle is greater than 10%, preferably greater than 25%.

According to a preferred embodiment, control signal CT corresponds to the clock signal which sets acquisition times CS. As a variation, the frequency of signal CT is greater than that of signal CS. To respect the synchronization of the falling edges, the period of the acquisition signal then is an integral multiple of that of control signal CT.

FIG. 8 schematically shows a 3-wire sensor also usable with the above-described interface. As compared with a 2-wire sensor, the difference is that the power supply of sensor 2 is dissociated from that of the interface (the sensor has its own ground connection).

As a result, when the sensor is off, no current flows through resistor R, independently from the position of switch 40 of interface 3. When the sensor is on, the current which flows only depends on the state of switch 40 and does not comprise the sensor supply current. Accordingly, the savings in terms of dissipation are lower than for a two-wire sensor.

The described embodiments enable to decrease the dissipation of an interface circuit. This dissipation decrease enables one to provide integrated circuits having a greater number of inputs.

Specific embodiments of the present invention have been described. Various alterations and modifications will occur to those skilled in the art. In particular, although the present invention has been described in relation with an application more specifically adapted to the 61131-2 standard, it more generally applies as soon as similar problems are posed. Further, the dimensions to be given to the different components and especially to the current sources and resistors of the interface circuit depend on the application and this sizing is within the abilities of those skilled in the art based on the functional indications given hereabove and on the concerned sensors. The same applies for the selection of the duty cycle of the control signal.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for converting the state of a sensor into a signal interpretable by an electronic circuit, the sensor being configured to be connected between a terminal of application of a first power supply voltage and an input terminal, comprising:
   a comparator of the voltage level of the input terminal with respect to a reference level;
   the electronic circuit configured to sample an output of the comparator at a first frequency;
   a current-limiting element between said input terminal and ground; and
   a switching element in series with the current-limiting element and configured to be controlled by a pulse train, the first frequency being synchronized with falling edges of the pulse train.

2. The circuit of claim 1, wherein a visual indicator is in series with the current-limiting element and the switching element.

3. The circuit of claim 1, wherein the duty cycle of the pulse train is greater than 10%.

4. The circuit of claim 1, wherein the duty cycle of the pulse train is greater than 25%.

5. The circuit of claim 1, wherein the sensor has a capacitive impulse response in an inactive state.

6. The circuit of claim 1, wherein the sensor is a two-wire sensor.

7. An integrated circuit comprising several circuits according to claim 1.

8. A method of acquiring the state of a sensor comprising:
   receiving at an input terminal a current corresponding to a state of the sensor;

limiting the current flowing between said input terminal and ground by way of a current-limiting element;

controlling operation of said current-limiting element by way of a switching element, said switching element controlled by a pulse train;

comparing a voltage level of said input terminal with respect to a reference level; and sampling the output of a comparator circuit at preselected times, the preselected times being synchronized with falling edges of the pulse train.

9. The method of claim 8, wherein a duty cycle of the pulse train is greater than 10%.

10. The method of claim 8, wherein a duty cycle of the pulse train is greater than 25%.

11. The method of claim 8, wherein the sensor is a two-wire sensor.

12. The method of claim 8, wherein the sensor is a three-wire sensor.

13. The method of claim 8 further comprising generating the pulse train with a controller element, the controller element receiving a clock signal.

14. A method of converting a state of a sensor into a signal interpretable by an electronic circuit, the method comprising:

receiving a first current at an input terminal, the first current corresponding to a state of the sensor;

controlling the current flowing between the input terminal and a ground with a current-limiting element;

operating the current-limiting element with a switching element, the switching element being controlled by a pulse train;

comparing a first voltage level of the input terminal with a second voltage level, the second voltage level being a reference level; and acquiring an output of a comparator circuit at preselected times, the preselected times being synchronized with falling edges of the pulse train.

15. The method of claim 14, wherein a duty cycle of the pulse train is greater than 10%.

16. The method of claim 14, wherein a duty cycle of the pulse train is greater than 25%.

17. The method of claim 14, wherein the sensor has a capacitive impulse response in an inactive state.

* * * * *